(12) United States Patent
Stauss

(10) Patent No.: US 7,459,727 B2
(45) Date of Patent: Dec. 2, 2008

(54) OPTOELECTRONIC COMPONENT AND METHOD OF FABRICATING SAME

(75) Inventor: Peter Stauss, Pettendorf (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 108 days.

(21) Appl. No.: 11/137,680

(22) Filed: May 25, 2005

(65) Prior Publication Data

US 2005/0266588 A1 Dec. 1, 2005

(30) Foreign Application Priority Data

May 28, 2004 (DE) .................... 10 2004 026 125

(51) Int. Cl.
*H01L 33/00* (2006.01)

(52) U.S. Cl. ....................... 257/89; 438/930

(58) Field of Classification Search ............. 438/22, 438/28, 93, 94, 336, 930, 936; 257/88–93, 257/103, E25.032
See application file for complete search history.

(56) References Cited

U.S. PATENT DOCUMENTS

| | | | |
|---|---|---|---|
| 5,391,896 A | 2/1995 | Wanlass | 257/80 |
| 5,684,309 A | 11/1997 | McIntosh et al. | 257/191 |
| 5,699,375 A * | 12/1997 | Paoli | 372/50.11 |
| 5,831,277 A | 11/1998 | Razeghi | 257/15 |
| 6,172,382 B1 | 1/2001 | Nagahama et al. | 257/94 |
| 6,487,230 B1 * | 11/2002 | Boucart et al. | 372/96 |
| 6,563,139 B2 | 5/2003 | Hen | 257/89 |
| 6,806,112 B1 * | 10/2004 | Horng et al. | 438/29 |

FOREIGN PATENT DOCUMENTS

| | | |
|---|---|---|
| DE | 198 19 543 | 11/1999 |
| DE | 100 26 255 | 11/2001 |
| EP | 1 017 113 A1 | 7/2000 |
| JP | 2003-152222 | 5/2003 |
| WO | WO 98/31055 | 7/1998 |
| WO | WO 99/57788 | 11/1999 |
| WO | WO 01/39282 | 5/2001 |

OTHER PUBLICATIONS

Schnitzer et al., "30% external quantum efficiency from surface textured, thin-film light-emitting diodes" *Appl. Phys. Lett.*, vol. 63, No. 16, pp. 2174-2176 (Oct. 18, 1993).

* cited by examiner

*Primary Examiner*—David Vu
(74) *Attorney, Agent, or Firm*—Fish & Richardson P.C.

(57) ABSTRACT

The invention concerns an optoelectronic component comprising a layer stack that includes at least two active zones and a carrier that is applied to the layer stack. The invention further concerns a method of fabricating such an optoelectronic component.

18 Claims, 2 Drawing Sheets

OPTOELECTRONIC COMPONENT AND METHOD OF FABRICATING SAME

CROSS REFERENCE TO RELATED APPLICATIONS

Pursuant to 35 U.S.C. § 119, this application claims the benefit of prior German Application 102004026125.3, filed May 28, 2004. The contents of the prior application is incorporated herein by reference in its entirety.

FIELD OF THE INVENTION

The invention concerns an optoelectronic component. In addition, the invention concerns a method of fabricating an optoelectronic component.

BACKGROUND OF THE INVENTION

The document DE 198 195 43 A1 describes a two-color light-emitting semiconductor device comprising, between its front side and its back side, a first surface-emitting LED (light-emitting diode) having a first active zone that emits radiation in a first wavelength and a second surface-emitting LED having a second active zone that emits radiation in a second wavelength. Disposed between the two active zones is a first reflecting layer that is reflective of the first wavelength and transparent to the second wavelength, and disposed between the second active zone and the back side is a second reflecting layer that is reflective of the second wavelength.

The document U.S. Pat. No. 5,391,896 describes a monolithic, multi-color optoelectronic component comprising an indium phosphite substrate with an upper and a lower side, a first zone that is applied to the surface of the substrate, and a second zone that is applied to the first zone. The first zone is preferably GaInAsP-based and the second zone InP-based. The two zones are grown in lattice-matched fashion. The second zone has a larger band gap than the first zone.

Additional zones having successively increasing band gaps can also be applied. With the component, light of different colors can be emitted and received simultaneously or at different times.

SUMMARY OF THE INVENTION

Embodiments of the invention include an optoelectronic component that can be used in a particularly versatile manner and a method of fabricating such an optoelectronic component.

For example, in aspect, the invention features an optoelectronic component that includes a layer stack including at least two active zones and that comprises a carrier on which the layer stack is disposed. Embodiments of the optoelectronic component may include any of the following features.

The term "layer stack" can be understood to mean, for example, a sequence of layers stacked one on top of the other. The layers are for example deposited epitaxially on a growth substrate. The active zones are preferably arranged one over the other vertically with their flat sides adjacent. That is, the layers of the layer stack are preferably monolithically integrated.

Particularly preferably, the layer stack is a sequence of layers from which the growth substrate has been removed after completion of the epitaxial growth. Particularly preferably, a carrier is applied to the surface of the layer stack that faces the original growth substrate. This means that the carrier is not the original growth substrate. Components that are fabricated by removing the growth substrate from an epitaxially grown layer sequence are also often referred to under the generic term "thin film components."

By way of background, a basic principle of a thin-film component is described, for example, in I. Schnitzer et al., *Appl. Phys. Lett.* 63 (16), Oct. 18, 1993, pages 2174-2176, whose disclosure content as to the basic principle of thin-film components is incorporated herein by reference.

For example, a thin-film LED is, as a good approximation, a Lambertian surface radiator, and is therefore particularly well suited for use in a searchlight or headlight.

It is particularly advantageous that the carrier can be relatively freely selected in comparison to the growth substrate. The carrier can thus be better suited to the component with regard to a number of properties, such as conductivity or stability, than available growth substrates that are subject to tight constraints in the production of high-quality epitaxially grown layer sequences. For instance, in order to obtain high-quality epitaxial layers, the epitaxially deposited material must for example be lattice-matched to the growth substrate.

The carrier applied to the layer stack is preferably distinguished by a thermal expansion coefficient that is matched to the layer stack. For example, the carrier can contain a semiconductor material such as germanium, gallium arsenide, gallium nitride, silicon carbide or other materials such as sapphire, molybdenum or metals.

According to a preferred embodiment of the optoelectronic component, a mirror layer is disposed between the applied carrier and the layer stack. The mirror layer can, for example, include a Bragg mirror or a metal-containing mirror layer. A metal-containing mirror, which can for example contain gold, gold/germanium, silver, aluminum or platinum, is distinguished from a Bragg mirror by, for example, a reflectivity that is less directionally dependent. In addition, higher reflectivity can be obtained with metal-containing mirrors than with Bragg mirrors. The mirror layer particularly preferably contains one of the following materials: gold, gold/germanium.

In a further preferred embodiment of the optoelectronic component, the active zones are arranged one over the other, parallel or substantially parallel to the carrier. "Substantially parallel" in this context means that for example during the epitaxial growth of the layer stack including the active zones, the layers may grow slightly obliquely on top of one another. In such a case the active zones are not arranged exactly parallel to the carrier. It is also possible that the carrier may not be applied exactly planarly to the layer stack. Here again, the active zone arrangement would not be exactly parallel to the carrier. Further process-induced deviations from an exactly parallel arrangement are also conceivable.

Particularly preferably, the active zones are suitable for generating electromagnetic radiation.

In such a case, every two active zones preferably have a common contact layer. This means that every two active zones can be contacted electrically via a common contact layer. Such a common contact layer for example forms the p-side contact of two adjacent active zones.

The active zones are preferably suitable for generating electromagnetic radiation in at least two different wavelengths.

Particularly preferably, each active zone can generate electromagnetic radiation of a different wavelength, that is, a different wavelength from the other active zones. The active zones can, for example, be suitable for generating light in the visible or invisible wavelength region of the electromagnetic spectrum. It is also possible for a portion of the active zones to be able to generate light in the visible region and another portion light in the invisible region of the spectrum, for example the infrared.

The active zones preferably emit the light generated therein in a main radiation direction that is perpendicular or substantially perpendicular to the carrier and is directed away from the carrier.

In addition, the active zones can, for example, comprise a pn junction, a double heterostructure, a single quantum well or, particularly preferably, a multiple quantum well (MQW) structure. Structures of this kind are known to the skilled person and thus will not be elaborated upon here. Examples of MQW structures are described in the documents WO 01/39282, WO 98/31055, U.S. Pat. No. 5,831,277, EP 1 017 113 and U.S. Pat. No. 5,684,309, whose disclosure content as to MQW structures is incorporated herein by reference.

The term "quantum well structure" in the context of the application encompasses any structure in which charge carriers undergo quantization of their energy states by confinement. Specifically, the term "quantum well structure" implies no statement as to the dimensionality of the quantization. It therefore includes, among other things, quantum wells, quantum wires and quantum dots and any combination of these structures.

Particularly preferably, the layer stack includes, for example, two active zones that are suitable for generating light of different wavelengths. That is, a first active zone generates electromagnetic radiation of a first wavelength and a second active zone generates electromagnetic radiation of a second wavelength.

In a further preferred embodiment of the optoelectronic component, one active zone is transparent to the electromagnetic radiation from the active zones disposed under it. This can be achieved, for example, by having the band gaps of the active zones become larger upwardly from the carrier in the main radiation direction. This means that, with respect to all the active zones in the layer stack, the closer an active zone is to the carrier, the longer the wavelength of the electromagnetic radiation it generates.

Vertical stacking and thus spatial proximity of the radiation-generating active zones has proven particularly advantageous, since owing to the order of the radiation-generating zones in the main radiation direction, a common optical element with a common focus can be used for all the active zones. The optical element advantageously affords the possibility of adjusting the radiation characteristic of the optoelectronic component according to the field of application of the component. In particular, the optical element can be implemented as a refractive or diffractive lens.

In a preferred embodiment of the optoelectronic component, the active zones can be contacted independently of one another. This means that the active zones can be operated electrically independently of one another. It is thereby possible, for example, for each of the active zones to be able to generate electromagnetic radiation at a different time. Depending on the wavelength of the light to be generated, the proper active zone can be electrically contacted so that the desired radiation is produced.

In a further preferred embodiment, at least two active zones are suitable for generating electromagnetic radiation simultaneously. In this way it is advantageously possible to generate mixed light, for example by additive color mixing of the electromagnetic radiation generated in the individual active zones.

Particularly advantageously, the electromagnetic radiation emitted by the active zones can be selected so that the mixed light generated is white light. For example, in the case of two active zones, the one closer to the carrier can be selected so that it emits light of a first, larger wavelength, and the zone farther from the carrier can be selected so that it emits light of a second, smaller wavelength, the two wavelengths being selected so that the resulting mixed light is white light.

Particularly preferably, all the active zones can generate electromagnetic radiation simultaneously.

In a further preferred embodiment of the described component, the mirror layer is implemented as reflective of the electromagnetic radiation generated in the active zones. This means that the mirror layer is able to reflect the radiation of different wavelengths coming from the individual active zones. Thus there is a common mirror layer for the electromagnetic radiations generated in the active zones. Alternatively, plural mirror layers can be arranged over one another. The mirror layers concerned can be selected so that each reflects only the radiation that has been generated in a given active zone, at least one mirror layer thus being assigned to each wavelength of the radiation generated in the active zones.

In a particularly preferred embodiment, the optoelectronic component is a multi-color LED. This means that the active zones constitute a vertical sequence of LEDs arranged one above the other in the main radiation direction.

One practical example is a combination blinker and reverse light in a common reflecting system, constituted, for example, by a common optical element. Use in signal systems, such as traffic lights, for example, can also be envisioned. Here, the yellow lamp can be integrated into the red. Vertical stacking of the active zones in the main radiation direction has proven to be especially advantageous since it is particularly space-saving compared to a horizontal arrangement of LEDs.

In general, in another aspect, the invention features, a method of fabricating an optoelectronic component comprising the following steps: (a) epitaxially depositing a layer stack including at least two active zones on a substrate wafer, (b) applying a carrier to the surface of the layer stack that is opposite the substrate wafer, (c) removing the substrate.

Embodiments of the method may include any of the following features.

For example, the method steps preferably take place in the stated order.

It has been found particularly advantageous in connection with this method that a large number of the described optoelectronic components can be fabricated simultaneously from a wafer composite. The components can be produced especially quickly and inexpensively in this way.

In a particularly preferred embodiment of the method, before step (b) of the method a mirror layer is applied to the surface of the layer stack that is opposite the wafer substrate. The mirror layer can be applied for example by sputtering or vapor deposition.

The here-described optoelectronic component and the method for fabricating such a component are described in more detail below on the basis of embodiment examples and the related figures.

Additional aspects, advantages, and features follow.

Figure 1:
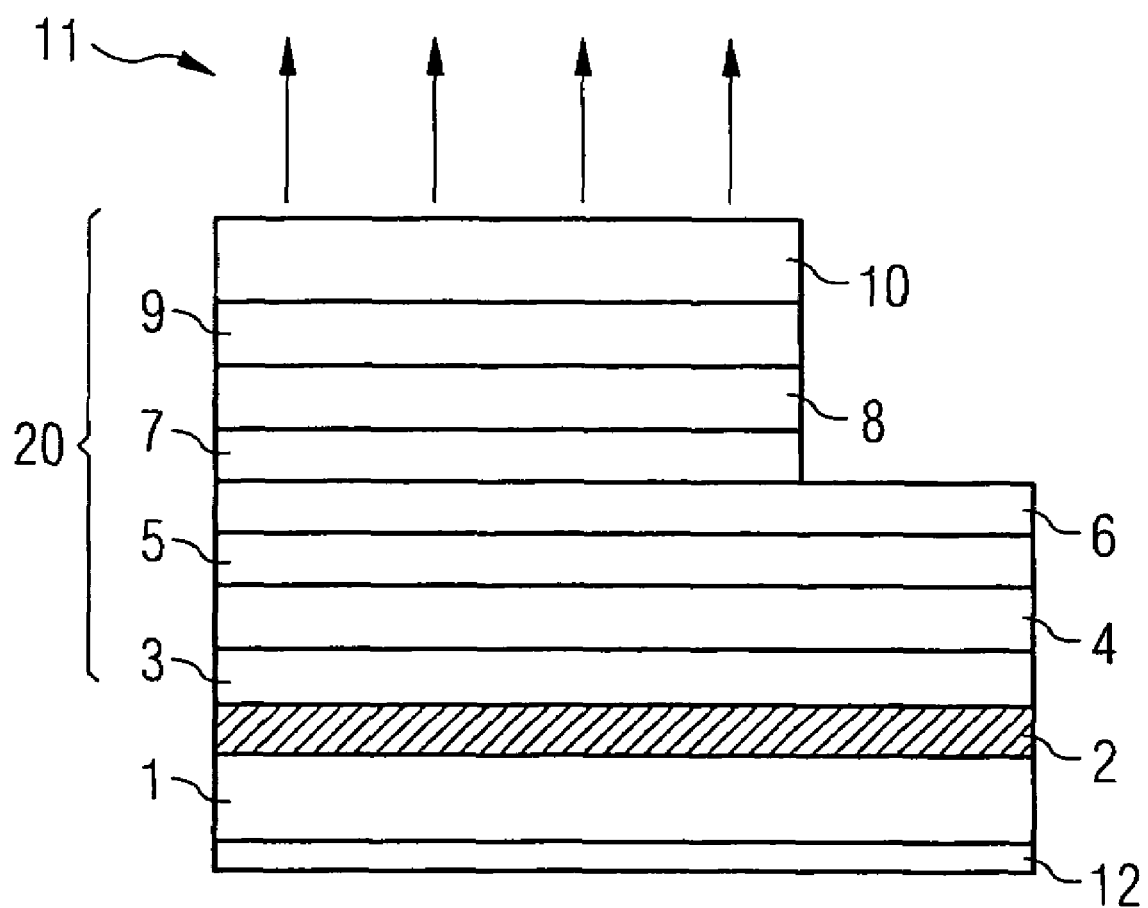
FIG. 1 shows a cross section through the here-described component in the form of a diagrammatic sketch.

In the embodiment examples and figures, like or like-acting parts are provided with the same reference numerals. The illustrated parts and the sizes of the parts with respect to one another should not be considered true to scale. Rather, some details of the figures have been exaggerated in size to improve comprehension.

DETAILED DESCRIPTION OF THE INVENTION

FIG. 1 shows an optoelectronic component. Applied to the carrier 1 is a mirror layer 2, followed by the layer stack 20. The carrier 1 can contain, for example, germanium, gallium arsenide, silicon carbide, molybdenum or another suitable material. Its thermal expansion coefficient is advantageously matched to that of the layer stack 20, so that the heat evolved during the operation of the optoelectronic component does not place mechanical stress on the component at the interface between carrier 1 and layer stack 20. Moreover, carrier 1 is advantageously distinguished by good thermal conductivity. Thus the heat generated in the component can be rapidly dissipated to the environment. This increases the life of the component and enables it to be operated at higher power levels.

Mirror layer 2 preferably contains gold or gold/germanium. It is suitable for reflecting the radiation generated in the component. Mirror layer 2 is distinguished in particular by its high reflectivity. This advantageously increases the radiation output of the component, since little or no radiation can be lost for example by absorption in carrier 1. Mirror layer 2 is preferably vapor-deposited or sputtered on carrier 1. Carrier 1 and mirror layer 2 are glued, soldered or bonded to layer stack 20.

In the here-described embodiment example of the optoelectronic component, layer stack 20 includes two active zones. The structure of layer stack 20 in this example is as follows: mirror layer 2 is followed by an n-cladding layer 3, for example containing n-doped InGaP. n-cladding layer 3 serves to confine the charge carriers in the first active zone 4. It is followed by first active zone 4, which is suitable for generating electromagnetic radiation of a given first wavelength. Active zone 4 can contain a pn junction, a double heterostructure, a single quantum well or, particularly advantageously, a multiple quantum well structure. For example, first active zone 4 contains InGaAlP. It is followed by a first p-cladding layer 5 containing p-doped InGaAlP, for example. Applied to first p-cladding layer 5 is a p-contact layer 6.

Both first active zone 4 and the subsequent second active zone 8 are electrically contacted on the p-side via this p-contact layer 6. The latter is advantageously transparent to the electromagnetic radiation generated in first active zone 4 and has sufficient conductivity for contacting the two active zones. For this purpose, p-contact layer 6 contains, for example, InGaAlP with an aluminum concentration of between 45% and 55%, preferably of about 50%, or AlGaAs with an aluminum concentration of between 55% and 65%, preferably 60% aluminum. p-contact layer 6 is exposed, for example by selective etching, to an extent such that the active zones can be contacted via this p-contact layer 6 sufficiently for the operation of the component.

P-contact layer 6 is followed by a second p-cladding layer 7, for example containing p-doped InGaAlP. After that comes the second active zone 8. Second active zone 8 can be similar in structure to first active zone 4 and preferably generates electromagnetic radiation of a second wavelength. This second wavelength is advantageously smaller than the first wavelength, i.e., the second active zone preferably has a larger band gap than the first active zone, and the longer-wavelength electromagnetic radiation generated in first active zone 4 is therefore able to penetrate second active zone 8 without being absorbed.

Second active zone 8 is followed by a second n-cladding layer 9, for example containing n-doped InGaAlP.

Layer stack 20 is terminated on its upper and lower sides by a first n-contact layer 10 and a second n-contact layer 12, respectively. First n-contact layer 10 is advantageously transparent to the radiation emitted by the active zones, which is radiated in a main radiation direction 11. First n-contact layer 10 can be contacted for example by means of a bonding pad placed on the surface over to one side. That is, the bonding pad is arranged for example in a corner on the upper side of n-contact layer 10.

A second embodiment example differs from the first solely in that layer stack 20 is constructed on the basis of an InGaAs system, i.e., the cladding layers contain suitably doped InAlGaAs and the active zones suitably doped InGaAs. The common p-contact layer 6 contains, for example, InAlGaAs having a suitably high aluminum concentration. It has advantageously been found in connection with this embodiment example that electromagnetic radiation in the infrared region can be radiated by the active zones.

Advantageously, other material systems are also suitable for producing the described components. The skilled person can select suitable materials according to the use requirements placed on the component. For example, the choice of material can be determined by the desired wavelengths to be emitted by the active zones. In the described embodiment examples, the layer sequence can also be modified so that the active zones are contacted by a common n-contact layer instead of a common p-contact layer.

Figure 2A:
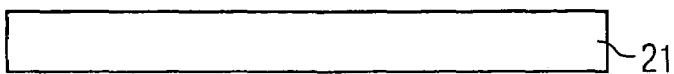
FIGS. 2a to 2e illustrate the here-described method in the form of diagrammatic sketches.

FIGS. 2a to 2e show a method of fabricating the described optoelectronic component. A substrate wafer 21 is first provided, as illustrated in FIG. 2a. This substrate wafer can be for example a GaAs, InP or SiC wafer, depending on the material system in which the layer stack 20 is to be formed.

Figure 2B:
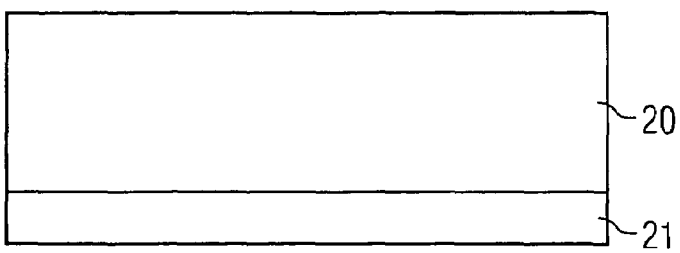

Layer stack 20, including a desired number of active zones, is deposited epitaxially on substrate wafer 21 (see FIG. 2b).

Figure 2C:
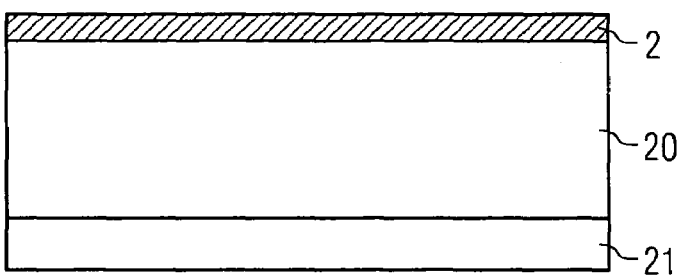

A mirror layer 2 is then deposited on the surface of layer stack 20 that faces substrate wafer 21 (FIG. 2c). This can be done by vapor-deposition or sputtering, for example. Mirror layer 2 preferably contains a metal.

Figure 2D:
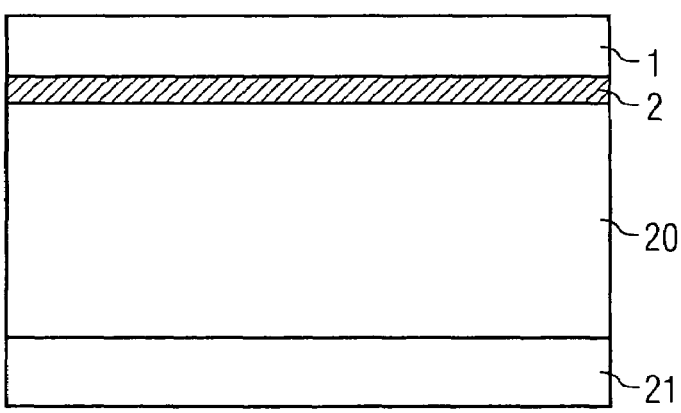

FIG. 2d shows the attachment of carrier 1 to the surface of the layer stack 20/mirror layer 2 arrangement that faces substrate wafer 21. Carrier 1 is advantageously applied by means of a solder joint, a glued joint or, particularly advantageously, a wafer bonding process.

Figure 2E:
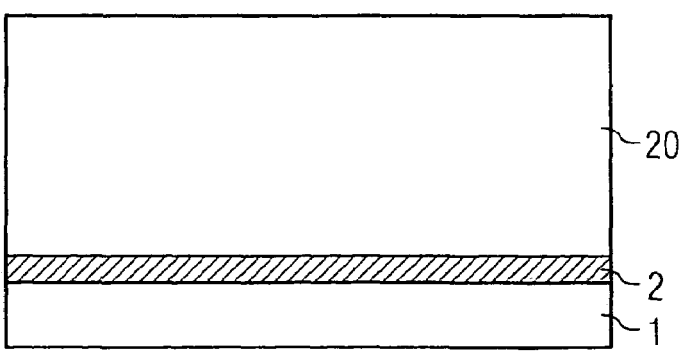

Substrate wafer 21 is then removed from layer stack 20 (FIG. 2e). Examples of suitable removal methods are laser-supported processes such as laser ablation and mechanical methods such as grinding or etching.

In further method steps, the arrangement is singulated, n-contact layers are applied and the common contact layers of the active zones are exposed, for example by selective etching. The order of these method steps can advantageously be freely selected.

This patent application claims the priority of German Patent Application 102004026125.3-33, whose disclosure content is incorporated herein by reference.

The invention is not limited by the description based on the embodiment examples. Rather, the invention encompasses any novel feature and any combination of features, including in particular any combination of features recited in the claims, even if said feature or combination itself is not mentioned explicitly in the claims or the embodiment examples.

Accordingly, additional embodiments are within the scope of the following claims.

What is claimed is:

1. An optoelectronic component, comprising a layer stack that includes at least two active zones and comprises a carrier applied to said layer stack, wherein the active zones are positioned in vertical alignment with respect to one another and parallel to said carrier to form a stack of active zones;

wherein each zone of the at least two active zones generates electromagnetic radiation having a different wavelength when a current is applied to the zone;

wherein the stack comprises pairs of active zones, each pair of active zones being contacted with a common contact layer positioned between the pair of active zones; and wherein said active zones can be contacted independently.

2. The optoelectronic component as recited in claim 1, comprising a mirror layer arranged between said layer stack and said carrier.

3. The optoelectronic component as recited in claim 2, wherein said mirror layer contains at least one of the following materials: Au, AuGe.

4. The optoelectronic component as recited in claim 2, wherein said mirror layer is implemented as reflective of the electromagnetic radiation generated in said active zones.

5. The optoelectronic component as recited in claim 1, wherein said active zones are suitable for generating electromagnetic radiation in at least two different wavelengths.

6. The optoelectronic component as recited in claim 5, wherein one active zone is transparent to the electromagnetic radiation from the active zones disposed under it.

7. The optoelectronic component as recited in claim 1, wherein at least two active zones are suitable for simultaneously generating electromagnetic radiation.

8. The optoelectronic component as recited in claim 1, wherein the optoelectronic component is a multi-color light-emitting diode.

9. The optoelectronic component as recited in claim 1, wherein the layers of said layer stack are monolithically integrated.

10. The optoelectronic component as recited in one of claims claim 1, wherein the component does not include a growth substrate.

11. The optoelectronic component as recited in claim 1, wherein said active zones are further contacted by different contact layers to enable independent electrical operation of said active zones.

12. A device, comprising:

a layer stack comprising at least two active layers, each one of the at least two active layers being offset with respect to the other active layers in a first direction and configured to emit radiation in the first direction, wherein each one of the at least two active layers comprises an independent electrical connection comprising a first electrical contact formed by a contact layer of the stack and a second electrical contact formed by a different contact layer of the stack, at least one of the contact layers for each active layer being a common contact layer for another of the active layers.

13. The device of claim 12, wherein during operation, when an electrical current passes between the first and second electrical contacts of an active layer, only that active layer emits radiation.

14. The device of claim 12, wherein at least some of the active layers are configured to emit radiation having a first central wavelength, and wherein at least some of the active layers are configured to emit radiation having a second central wavelength.

15. The device of claim 14, wherein the first central wavelength is in a visible region of the spectrum, and wherein the second central wavelength is in an infrared region of the spectrum.

16. The device of claim 12, wherein each of the active layers is configured to emit radiation having a different central wavelength.

17. The device of claim 12, wherein the first direction corresponds to a radiation propagation direction, and wherein each active layer is substantially transparent to radiation produced by preceding active layers positioned along the radiation propagation direction.

18. The device of claim 12, wherein at least two of the active layers are configured to emit radiation having different central wavelengths at the same time.

* * * * *